United States Patent
Stepanenko et al.

(10) Patent No.: US 7,048,423 B2
(45) Date of Patent: May 23, 2006

(54) INTEGRATED LIGHT AND ACCESSORY ASSEMBLY

(75) Inventors: Walter Kuzma Stepanenko, St. Clair Shores, MI (US); Jay DeAvis Baker, Dearborn, MI (US); Lawrence LeRoy Kneisel, Novi, MI (US); Richard Keith McMillan, Dearborn, MI (US); Brenda Joyce Nation, Troy, MI (US); Cindy Maria Rutyna, Plymouth, MI (US); Charles Frederick Schweitzer, Northville, MI (US); Peter Langer, Lexington, MI (US)

(73) Assignee: Visteon Global Technologies, Inc., Dearborn, MI (US)

(*) Notice: Subject to any disclaimer, the term of this patent is extended or adjusted under 35 U.S.C. 154(b) by 400 days.

(21) Appl. No.: 09/966,634

(22) Filed: Sep. 28, 2001

(65) Prior Publication Data

US 2003/0063477 A1 Apr. 3, 2003

(51) Int. Cl.
*B60Q 1/26* (2006.01)

(52) U.S. Cl. .............. 362/507; 362/540; 362/545; 340/425.5

(58) Field of Classification Search ............ 362/545, 362/540, 464, 800, 507; 340/815.4, 425.5, 340/457, 469
See application file for complete search history.

(56) References Cited

U.S. PATENT DOCUMENTS

| | | | |
|---|---|---|---|
| 4,471,414 A | 9/1984 | Savage, Jr. | |
| 4,600,977 A | 7/1986 | Barlian et al. | |
| 4,683,517 A | 7/1987 | Yazvac | |
| 4,812,814 A | 3/1989 | Elliott | |
| 4,970,630 A | 11/1990 | Mudrovich | |
| 5,017,833 A | 5/1991 | Clarke et al. | |
| 5,213,413 A | 5/1993 | Weathers | |
| 5,349,172 A | 9/1994 | Roustaei | |
| 5,378,158 A | 1/1995 | Owen et al. | |
| 5,444,604 A | 8/1995 | Hiner et al. | |
| 5,455,749 A | 10/1995 | Ferber | |

(Continued)

FOREIGN PATENT DOCUMENTS

| | | |
|---|---|---|
| DE | 198 01 587 A1 | 2/1999 |
| EP | 0 735 799 A2 | 2/1996 |
| JP | 07142820 * | 6/1995 |

OTHER PUBLICATIONS

European Search Report May 7, 2004, Ref. P3289.EP/RAM.

*Primary Examiner*—Thomas M. Sember
*Assistant Examiner*—Hargobind S. Sawhney
(74) *Attorney, Agent, or Firm*—Brinks Hofer Gilson & Lione (57) ABSTRACT

An integrated light and accessory assembly for a vehicle is disclosed. The assembly includes at least one lamp for illumination of a vehicle, and also includes reflective, conductive and insulative portions inside a housing, and a module for controlling or accessorizing the assembly. Also disclosed is a method of manufacturing the assembly. The method includes providing materials for molding or shaping the components of the assembly, selectively etching conductive materials, molding the materials into a desired configuration, connecting a lamp and an accessory module to the conductive portions, and enclosing the components in a housing. A portion of the module may be removed for emergency lighting.

22 Claims, 9 Drawing Sheets

U.S. PATENT DOCUMENTS

| | | | |
|---|---|---|---|
| 5,490,048 A | | 2/1996 | Brassier et al. |
| 5,580,156 A | * | 12/1996 | Suzuki et al. .............. 116/63 P |
| 5,669,698 A | | 9/1997 | Veldman et al. |
| 5,746,497 A | | 5/1998 | Machida |
| 5,765,940 A | | 6/1998 | Levy et al. |
| 5,782,552 A | | 7/1998 | Green et al. |
| 5,797,672 A | | 8/1998 | Dobert |
| 5,865,531 A | | 2/1999 | Frey et al. |
| 5,879,073 A | | 3/1999 | Hori et al. |
| D410,427 S | | 6/1999 | Kokones |
| D413,099 S | | 8/1999 | Brandt et al. |
| 5,938,310 A | | 8/1999 | Leaman et al. |
| 5,982,059 A | | 11/1999 | Anderson |
| 6,015,313 A | | 1/2000 | Davis et al. |
| 6,016,038 A | | 1/2000 | Mueller et al. |
| 6,033,087 A | | 3/2000 | Shozo et al. |
| 6,076,950 A | | 6/2000 | Topping et al. |
| 6,079,858 A | * | 6/2000 | Hicks ......................... 362/486 |
| 6,095,867 A | | 8/2000 | Brandt et al. |
| 6,113,422 A | | 9/2000 | Somerville et al. |
| 6,124,886 A | * | 9/2000 | DeLine et al. .............. 340/433 |
| 6,139,174 A | | 10/2000 | Butterworth |
| 6,149,288 A | | 11/2000 | Huang |
| 6,152,590 A | | 11/2000 | Fürst et al. |
| 6,161,910 A | | 12/2000 | Reisenauer et al. |
| 6,168,725 B1 | | 1/2001 | Achari et al. |
| 6,179,644 B1 | | 1/2001 | Adams et al. |
| 6,367,949 B1 | * | 4/2002 | Pederson .................... 362/240 |
| 6,400,308 B1 | * | 6/2002 | Bell et al. ................... 340/901 |

* cited by examiner

INTEGRATED LIGHT AND ACCESSORY ASSEMBLY

FIELD OF THE INVENTION

The present invention relates to lighting and lighting assemblies, and particularly to lighting assemblies having lighting and other functions for automotive and vehicular applications. This application is related to co-pending application "Etched Metal Light Reflector for Vehicle Feature Illumination," U.S. patent application Ser. No. 09/966,495, assigned to the same assignee as the present invention and filed the same day as the present invention. The entire contents of the co-pending application are hereby incorporated by reference.

BACKGROUND OF THE INVENTION

A typical vehicle has many lights on its exterior, including standard low-beam headlights, high-beam headlights, parking lights, turn indicator lights, fog lights, side-indicator lights, running lights, back-up lights, brake lights, and so on. The exterior lights used on vehicles generally, and especially on passenger automobiles, are made from many small parts. These parts add cost and complexity to the structure of the various lighting assemblies. The parts and materials used in these lights must have many properties and meet many requirements for satisfactory application.

These requirements include electrical conductivity in some parts and electrical resistance in others. Some parts or portions of parts must be highly reflective in order for best utilization of the lamp, while other parts must have high strength and high rigidity in order for the light to maintain dimensional integrity in all conditions of use. These conditions may vary from very cold, dry winters to very hot summers with high humidity. In addition to these material performance requirements, the customer and the manufacturer is keenly interested in keeping the number of parts and the cost of the lighting assemblies at a minimum. In addition, with so many lights and lighting assemblies on any one vehicle, it would be desirable if at least one of the many lights on a vehicle could be removed. That is, it would be desirable if at least one of the lights on a vehicle could be removed along with a source of power for use in emergencies. These emergencies could include use as marker flares along a road, or for general illumination at night in emergency service. In addition, since lighting assemblies provide an interface between a vehicle and the environment in which the vehicle functions, it may be economical to provide additional functions suitable for an interface into the assembly. These additional functions may include radar detection, tollway acknowledgement and payment, a vision camera or sensor, and other functions useful or necessary in a motor vehicle.

What is needed is a lighting assembly that has fewer parts, is made for a low cost, and is sufficiently modular that it may provide additional functions. What is also needed is a lighting assembly in which at least a portion of the assembly could be removed from a vehicle for remote lighting service.

BRIEF SUMMARY

One embodiment is an integrated light and accessory assembly for a motor vehicle, the assembly including an insulator, at least one reflector bonded to the insulator, at least one conductor bonded to the insulator, and at least one lamp connected to the at least one conductor, the lamp assembled inside the reflector. The assembly also includes a control module mounted on the opposite side of the insulator, such as a plug-in module, and connected to the at least one conductor, the control module acting as a controller or power supply for the at least one lamp. While plug-in modules may be used, modules may also be assembled in other manners, such as by soldering or brazing. The lamp and the reflector are suitable for providing illumination for a motor vehicle, and the lamp and reflector may be used as a headlight, a turn light, a side running light, a parking or running light, a flasher light, a fog light, or a taillight. The lamp, the reflector, the insulator and the conductor, and the control module are contained within a housing, which may act as a lens for the light assembly.

Another embodiment of the invention is a method of manufacturing the integrated light assembly. It has been found economical to use metal foils for certain aspects of light assemblies. The method thus includes furnishing at least one metal foil, and molding the metal foil to an insulator. The metal foil may be copper or aluminum, or may be a copper-aluminum bi- or tri-metallic composite foil, having an inner layer of aluminum and outer layers of copper. The layers may be separated by layers of insulative material. Once formed and molded to an insulator, the metal may be selectively etched to leave copper or aluminum traces where conductive paths are desired on one side of the insulator. A control module and a lamp are then connected appropriately to the conductive traces, so that the control module and the lamp are connected to a source of electric power. The insulator, the etched foil, the lamp and the control module are then enclosed in a housing.

Many other embodiments of the invention are possible.

DETAILED DESCRIPTION OF THE PRESENTLY PREFERRED EMBODIMENTS

Figure 1:
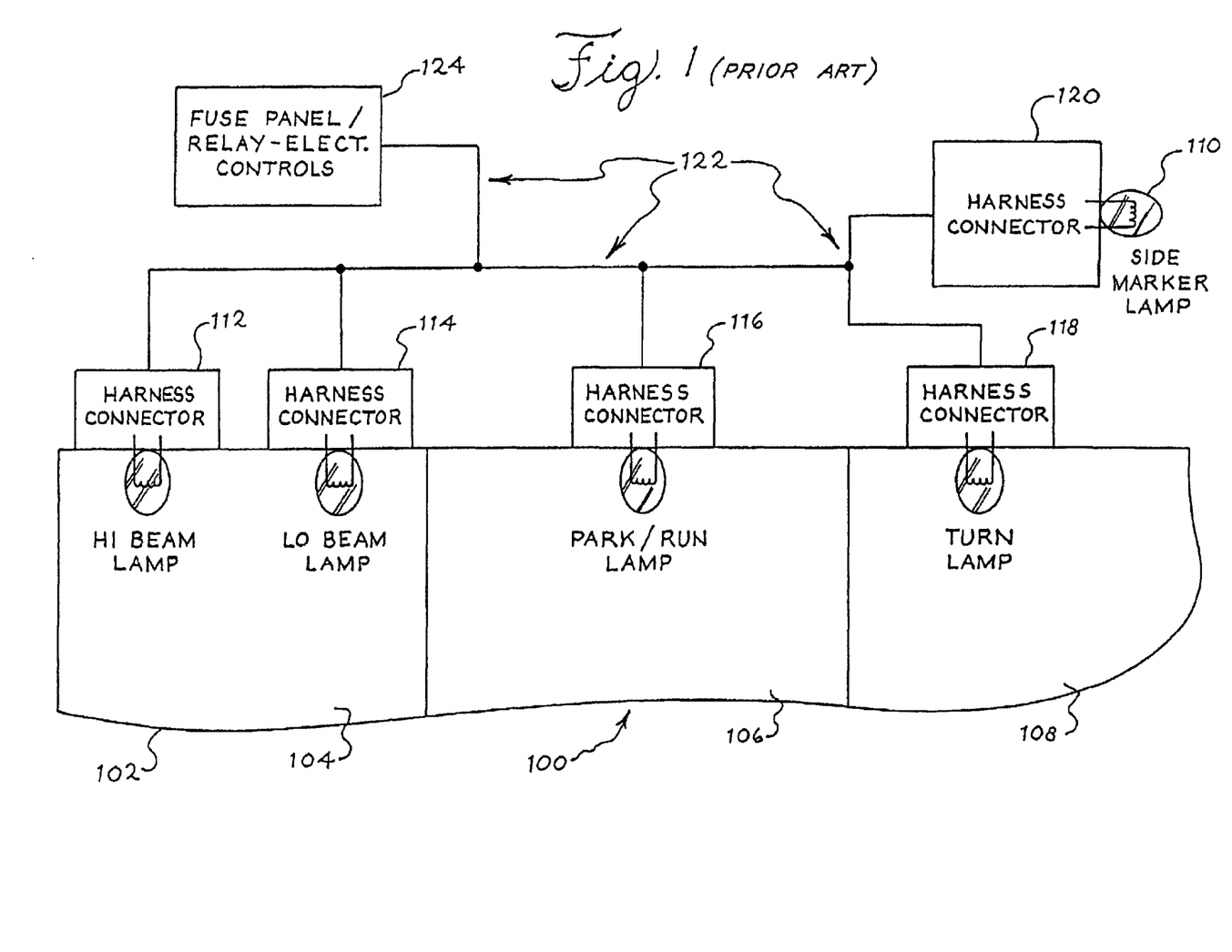
FIG. 1 is a block diagram of a prior art light assembly.

FIG. 1 is a prior art automotive headlight or taillight assembly 100. The assembly 100 includes a housing 102, which may also act as a lens for the road illumination lamps 104, a park/run lamp 106, a turn lamp 108 and a side marker lamp 110. Each lamp is secured to the housing and connected, typically with a harness connector 112, 114, 116, 118, 120, through harnesses 122, leading to a fuse panel/controller module 124. It is both time-consuming and costly to assemble such a device onto a truck or an automobile, when considering the number of electrical and mechanical connections required by such an assembly.

Figure 2:
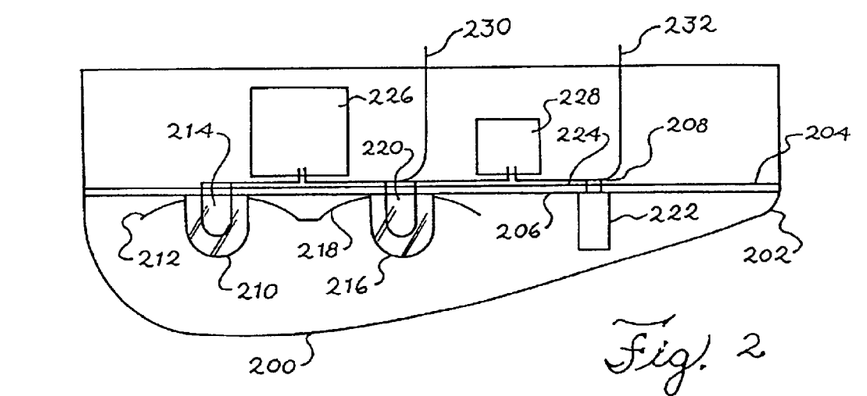
FIG. 2 is a top view of an integrated light assembly.

FIG. 2 is an embodiment of an integrated light assembly 200, suitable for use as a headlight assembly, a taillight assembly, or as a side light or parking light assembly, providing illumination for an automobile or a truck. The assembly 200 includes a housing 202, of which one portion may act as a lens for the lamps inside the housing. The assembly also includes a substrate or insulation layer 204. The insulation layer 204 is sufficiently stiff to resist deformation under automotive use environments, including all-weather conditions, humidity, vibration, shock and cyclic fatigue. The insulation layer 204 has a metal foil 206 on one side and has a conductive layer 208 on the other side. A first lamp 210, for instance, a low-beam lamp, is secured to the substrate 204 and is mounted in a reflector 212, for reflecting the light from the lamp and directing the light in the desired direction. Conductive path or traces 214 conduct power to the first lamp 210.

The lamp may be any lamp capable of emitting useful illumination for the vehicle, including incandescent lamps, light-emitting diodes (LEDs), or a high-intensity discharge (HID) lamp. LEDs may comprise an array of several or many LEDs, such as a cluster of LEDs arranged for maximum reflectivity and illumination. A second lamp 216, such as a high-beam lamp, may also be mounted to the substrate 208, housed within a reflector 218, and connected to electric power by conductive traces 220. The traces connecting lamps 210, 216 to electrical power receive power from a control module 226.

The control module 226 may have one or more functions. The module may be a power supply, receiving 12-volt power from an automotive battery and performing power conversion on incoming power, such as a DC-to-DC power supply. The control module may provide a voltage regulating function. The control module may function as a current source, for instance, if one or more lamps are LED clusters, requiring a current-controlled power supply. The control module may function as a DC-to-AC power supply, if one of the lamps is a HID lamp, requiring 24–30 volts AC power rather than 12 volts DC.

A device 222 offering an additional function is also mounted on the substrate 204, and is connected by traces 224 to a control module 228. In this embodiment, power and control for the modules are connected through conductors 230, 232. The device 222 offering an additional function may be one of many types or kinds. The device may be a tollway transponder, allowing for the automatic collecting of tolls on a highway and the automatic debiting of the customer's account. In one embodiment, the control module 228 may only need to supply power to the transponder. In other embodiments, the module may contain sufficient memory to allow a motorist to check an account balance or total tollway spending.

In other embodiments, the device may be a transponder or communicator enabling automatic payment or billing for fuel or other purchases at vendors employing the appropriate communications. Other applications may provide for communications with a garage-door opening device, enabling an vehicle to automatically open a garage door and turn on a light inside a garage upon approach.

Other devices may also be useful, including an antenna, a sensor or a transmitter. An antenna may emit signals from an active device on board a truck or an automobile. The signals may include an emergency signal from an accelerometer or a safety device, such as an airbag that has been activated. The signal may be sent to a roadway emergency center. The antenna may also receive signals and pass them on to a communication center or other vehicular communications controls. A sensor may include a radar detector, detecting a radar signal and sending a warning to a vehicle operator or vehicular control. Other sensors may include those for receiving signals indicative of a global positioning system (GPS), which signals may be processed by a control module in the assembly or elsewhere on the vehicle, to inform an operator of the vehicle of his or her location. A transmitter may include a video camera or an active radar transmitter for collision avoidance, sending a signal to a control module mounted in the assembly or elsewhere on the vehicle.

Devices with still other functions and other control modules may also be used. These devices may include other collision avoidance sensors or detectors, vehicle health-monitoring devices or sensors, steering sensors, and the like. Health-monitoring devices include, but are not limited to, control and monitoring modules for temperature sensors, tire-pressure sensors, oil-pressure sending units, hydraulic pressure sensors, and voltage or current monitoring modules. Other modules may include, but are not limited to, electric brake modules, regenerative braking modules, steer-by-wire modules, brake-by-wire modules, and active suspension system modules. Other applications may include video or infrared or laser or radar sensing of obstacles or controllers responding to items sensed. These integrated assemblies may thus be used for adaptive cruise control, pre-crash sensing, obstacle detection, obstacle avoidance, and other directional or security functions.

The substrate 204 of the light assembly plays an important part in the structural and cost designs of the assembly. The substrate is ideally about 2 to about 5 mm thick (about 0.075 to about 0.200 inches thick), and has sufficient rigidity to resist deformation under automotive use conditions. These conditions include environmental temperature, humidity, stress, vibration, shock, and fatigue. In addition, the substrate must resist the extra environmental loads of a lighting assembly, that is, the heat generated by the lamps and concentrated near the lamps. The substrate may be made from any suitable insulating material, and may be reinforced, for instance by glass fibers. Materials that have been found suitable include, but are not limited to, polycarbonate, acrylonitrile-butadiene-styrene (ABS) polymers, reinforced polypropylene, and nylon, among others. Other materials may also be suitable, so long as they are electrical insulators and possess the desired degree of rigidity.

The substrate may be laminated with metals on one or both sides. On the lamp side, it is desirable to have an aluminum reflector surrounding the lamp. Aluminum and aluminum alloys have sufficient reflectivity for this purpose. In one embodiment, aluminum is bonded to the substrate when the two are molded together. The molding may be performed in a tool that shapes the combined substrate and surface layer of aluminum into the shape of a reflector. In some instances, an aluminum foil, 3–10 mils thick (0.003 to 0.010 inches thick, about 0.075 to 0.250 mm thick) is insert-molded in an injection-molding or compression-molding process. For smaller volume production, the aluminum foil may be adhesively bonded to the substrate before the forming operation takes place. It is not necessary for the aluminum to be co-extensive with the plastic substrate, but there are considerable advantages in removing heat from the lamps and the assembly if the aluminum is coextensive with the plastic, acting as an extended surface to conduct heat away from the areas near the lamps and out toward the periphery of the light assembly. If desired, portions of the aluminum may be masked and other portions etched away if it is desired to selectively remove some of the aluminum remaining after molding or bonding to the substrate.

The light assembly is economical to manufacture if a conductor is applied on the other (non-lamp) side of the assembly. A thin cladding of copper is desirable as an electrical conductor, bringing power from the control modules or external conductors to components on the light assembly. A thin layer of copper, desirably 0.5 to 2.0 mils (0.0005 to 0.002 inches, about 0.013 to about 0.051 mm) is bonded to the substrate. The substrate may be molded onto the copper, such as by insert molding in an injection-molding or compression-molding process. The copper may also be adhesively bonded to the substrate if volumes are not sufficiently high to justify a high-volume molding process. Once the substrate is molded, bonded or clad onto the copper, portions of the copper to be retained as conductor traces or returns is masked. The copper is then etched, or selectively removed, from areas where the copper is not desired. Extra copper not interfering with electrical performance is desirably retained on the back side of the substrate, since the extra copper also acts as an extended surface, removing heat from areas near heat sources, such as control modules, and conducting heat to the periphery of the light assembly. More than one layer of copper, each layer separated by an insulating layer, may be used. For instance, a ground plane layer of copper or aluminum or both may be desirable. Other discrete or combined components may be assembled or mounted atop the substrate, connected by traces left from copper etch processes. If there are numerous components, one or more layers of copper may be required for traces to connect all the components. It may be convenient to mount a small circuit board, such as a voltage or current regulator made from surface-mounted electrical/electronic devices, rather than trying to assemble such devices separately. One layer of copper or aluminum or both may be used as a supply or return. All of these embodiments are meant to be included in the claims below. "Copper" includes any useful copper alloy.

Figure 3A:
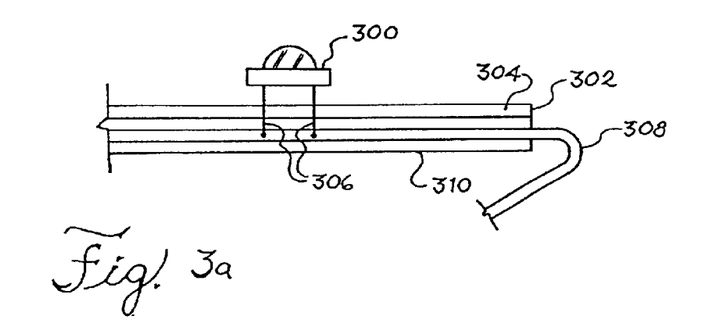
FIG. 3 is an embodiment of a composite structure for supporting and providing power to the lamps.
Figure 3B:
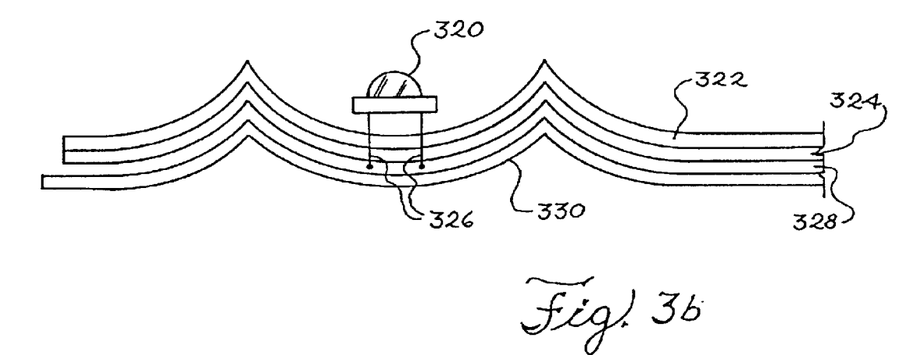

FIGS. 3–5 contain examples of composite materials with multiple layers of conductive, insulative, and reflective materials. Useful embodiments include several combinations of layers of materials. FIGS. 3a and 3b depict a structure in which a lamp 300, 320 has a reflective layer 302, 322 immediately beneath and facing the lamp, for maximum reflectivity and illumination. In FIG. 3a, lamp 300 is backed by reflective layer 302, desirably aluminum or other reflective material, such as a silvered surface or a highly polished reflective copper surface. Insulating layer 304 insulates the reflective layer 302 from conductive traces in layer 308. Insulating layer 304 may be any suitable, thin electrical insulator, such as 0.001 in (0.025 mm) of Kapton® or Nomex® insulation. The lamp has contacts 306 for receiving electrical power from traces or contacts in a flexible circuit or circuit pattern in layer 308. The traces or contacts are insulated from aluminum layer 302 or other conductive layers. Substrate 310 is a relatively rigid plastic or composite material, capable of supporting lamp 300 and other objects mounted to the substrate, such as control modules and the like. Substrate 310 is desirably about 0.075 to about 0.200 inches thick.

FIG. 3b is an alternate embodiment of the layered structure of FIG. 3a, in which at least the top two layers, reflective layer 322 and insulating layer 324 are formed in the shape of a reflector-dish for mounting and reflecting lamp 320. A conductive layer 328 has conductive paths or traces to provide electrical contact with lamp contacts 326. In one embodiment, a layer of copper is adhered or bonded to insulative, structural substrate 330, and is etched to leave conductive traces or paths. The substrate and traces are then bonded to reflective layer 322 and insulating layer 324. The bonding may be accomplished by adhesively bonding the layers. Alternatively, a reflective layer 322 may underlay an insulative layer 324 and traces in layer 328. The substrate layer 330 may then be insert molded directly to the other layers, for instance by injection molding or compression molding. Afterwards, the lamp is assembled and electrical contact is made with the traces in layer 328, by using through-hole soldering or joining techniques, or other methods to make electrical contact.

Figure 4A:
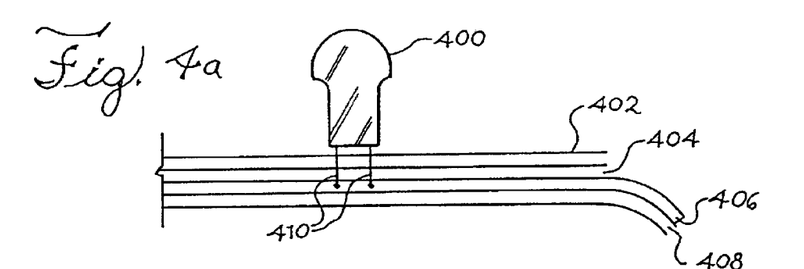
FIG. 4 is another embodiment of a composite structure for supporting and providing power to the lamps.
Figure 4B:
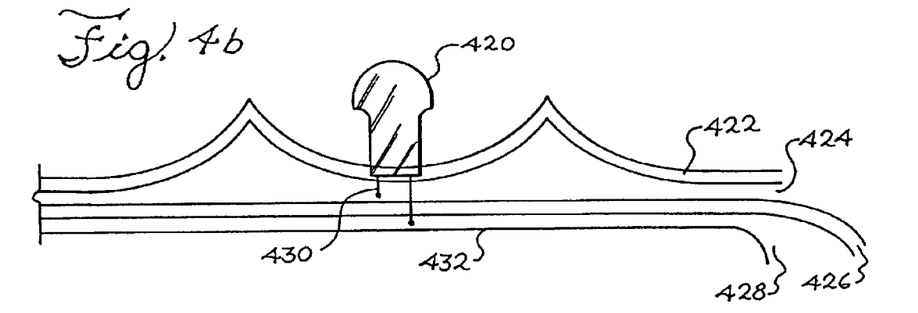

FIGS. 4a and 4b depict another embodiment of a composite structure. In the embodiment of FIG. 4a, a flat structure includes a substantially clear insulating substrate 402, such as unpigmented polycarbonate mounting a lamp 400. A reflective layer 404, desirably aluminum or other highly reflective surface, backs up the clear insulating plastic. The plastic is desirably molded or adhesively bonded to the aluminum or other highly-reflective surface. A third layer, insulating layer 406 may be flex-print or other insulating layer containing conductive traces or wires, and providing electrical power to lamp 400 through lamp contacts 410. Alternatively layer 406 may be a first insulating layer followed by a conductive layer, such as copper. Lamp contacts 410 are insulating to prevent electrical contact with conductive layer 404. A final insulative layer 408 may be needed to provide electrically insulation for electrical contacts or traces in layer 406.

FIG. 4b depicts an embodiment in which the clear plastic layer 422 and the reflective/conductive layer 424 have been molded or bonded together for mounting lamp 420 and providing a reflective layer 424 behind the plastic substrate 422. An insulative layer 426 and a conductive layer 428 are then bonded to the reflective layer 424. Lamp terminals 430, 432 connect to a power supply and return through conductive layers 424, 428. Alternatively, layer 426 may be two layers, including a first, thin insulating layer followed by a conductive layer, such as copper. The copper may be etched before final assembly to leave conductive traces as desired for making electrical contact with lamp leads 430.

Figure 5A:
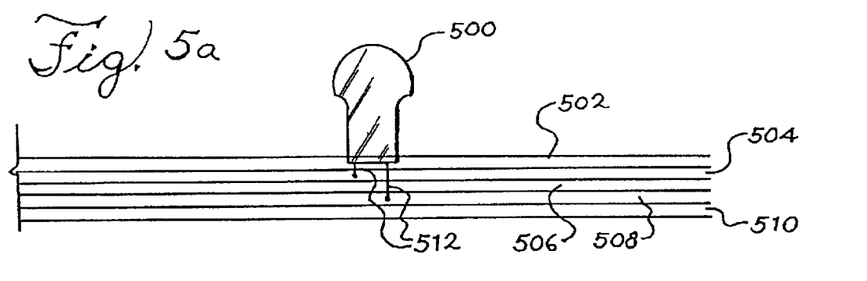
FIG. 5 is a yet another embodiment of a composite structure for supporting and providing power to the lamps.
Figure 5B:
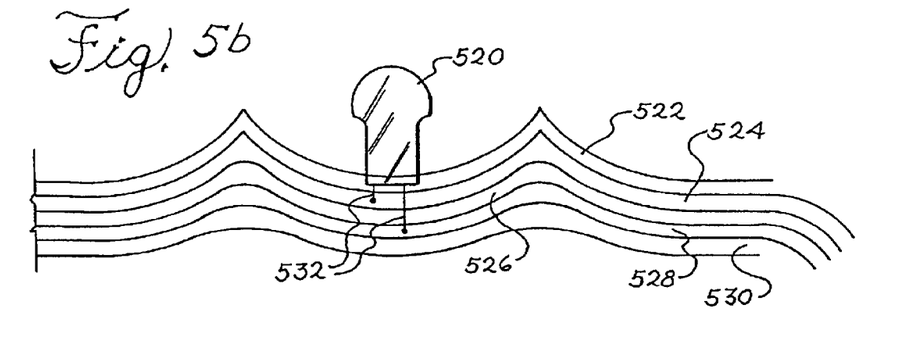

FIGS. 5a and 5b depict embodiments in which structural plastic layer 502 is mounted nearest the lamp, backed by reflective layer 504, and with the rear-most layers providing appropriate electrical conductors and insulators. In FIG. 5a, plastic or reinforced plastic substrate 502 mounts lamp 500. The plastic is desirably a translucent, optically clear, non-pigmented plastic, such as polycarbonate. A reflective layer 504 is underneath plastic layer 502, for reflecting light from lamp or LED 500. In one embodiment, the reflective layer 504 is made of a conductive material, such as polished aluminum. It is also possible that since the material is conductive, it may be used to conduct electricity, such as electric power to the lamp, or a return or ground from the lamp to an external contact. In FIG. 5a, one contact 512 from lamp 500 is shown connecting to layer 504 as either an source or a return of electric power. The next layer 506 may be an insulating layer, such as a thin layer of Kapton® or Nomex® insulation. Layer 508 may be a conductive layer, such as a copper foil, etched to leave conductors or traces as desired. Lamp 500 is depicted as having a contact 512 receiving electric power from a trace in layer 508. The last layer 510 is desirably another layer of insulating material, and may be a thin layer or alternatively may be a thick layer, such as a back surface of a housing of the light assembly.

In one embodiment, a layer of copper is bonded to insulating layer 510 and is etched to leave traces as conductive layer 508. An insulating layer 506 is bonded or overlaid on the conductive layer 508, as is overlaid by reflective layer 504. This assembly may then be used as in insert for when plastic substrate 502 is molded, as in an injection-molding or compression molding process. Alternatively, the assembly may be made by hand or by other methods. The layers may be bonded to each other with adhesives or film adhesives, and the film adhesives may function as an insulating layer, such as layer 506.

FIG. 5b depicts an embodiment in which at least the top layer 522 is formed to enhance the reflectivity of the lamp 520, i.e. with a bright, shiny, reflective surface. The construction of the composite layer structure in FIG. 5b may proceed as described for FIG. 5a, where it is understood that the curved surface is a three-dimensional conical or ellipsoid shape. Top layer 522 is desirably a structural, translucent, optically clear electrically-insulating plastic, underlaid by a reflective, conductive material 524. Layer 524 provides a positive power supply or return for lamp 520 through contact 532 in layer 524. In one embodiment, layer 524 may be a ground plane or a positive voltage supply. Insulating layer 526 underlays conductive layer 524 and is followed by second conductive layer 528. Layer 528 may be a copper foil or copper plate that is etched to provide traces where desired, to provide electrical power or return to lamp 520 through lamp contact 532. The bottom layer is insulating layer 530.

Figure 6:
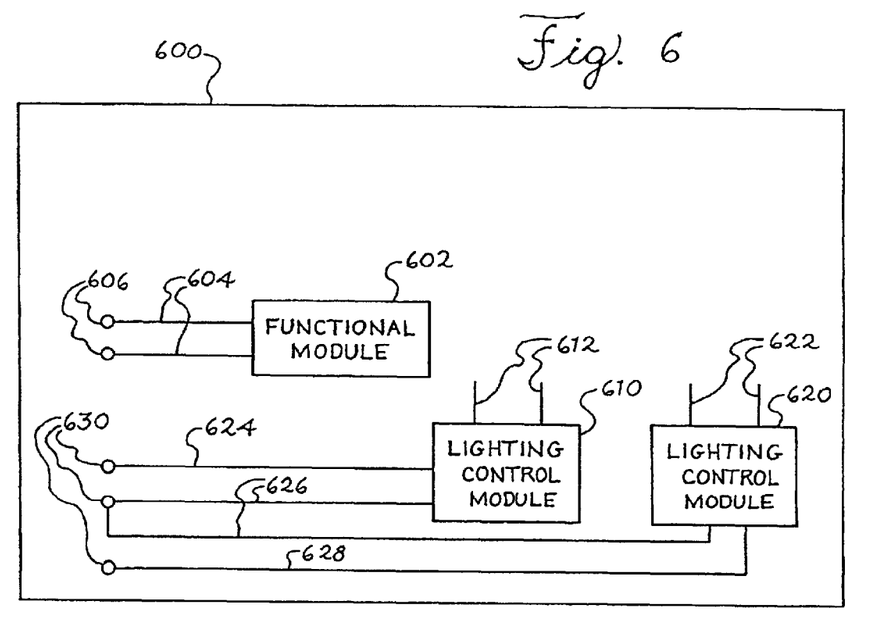
FIG. 6 is a plan view of the backside of an integrated light assembly.

FIG. 6 is a view of a back of a substrate in the integrated light assembly. The substrate 600 is desirably made from one of the plastic or insulating materials mentioned above. The substrate is molded or bonded onto a copper foil or conductive layer. The conductive layer is then etched, leaving the traces 604, 624, 626, and also traces 612, 622. The width of the traces may be determined by electrical design, e.g., for current carrying capacity or desired voltage drop. The traces may also extend out of the plane of the substrate for direct connections, as shown in FIG. 2 by conductors 230, 232. Such out-of-plane conductors are indicated in each of the figures by small dots at the end of a trace. Thus, in FIG. 6, conductors 606 are electrical connections to the traces 604. Conductors 606 may be traces that have been bent out of the plane of the substrate, connected to module 602. Module 602 is mounted to the substrate 600, and receives power from conductors 606 through traces 604. Module 602 may be any of the functional modules mentioned above, such as a tollway transponder or an antenna. FIGS. 6–10 depict the rear of the substrate, with traces connecting command/communications and external power to various modules and features of the rear of the substrate. The actual functions, such as headlights, flashers, antennae, sensors, etc., may be mounted on the front of the substrate and are thus are not depicted on the rear of the substrate.

FIG. 6 also depicts lighting control modules 610, 620, mounted to the substrate 600 and connected by traces 624, 626, 628 to conductors 630. conductors 630, 606 may be further gathered into a connector (not shown) at the rear of a housing (not shown), which encloses all the above components and may then be connected through a wiring harness to a vehicle controller and source of electric power. Lighting control module 610 may be a driver or a power source or controller for a low beam lamp (not shown) on the other side of the substrate 600. Two conductors 612 connect the module 610 to the low-beam lamp, the abrupt ending of the conductors suggesting a right-angle turn into or out of the substrate. In similar fashion, module 620 may be a controller or power source for a high beam lamp (not shown) on the other side of the substrate 600, connected by traces or conductors 622.

Figure 7:
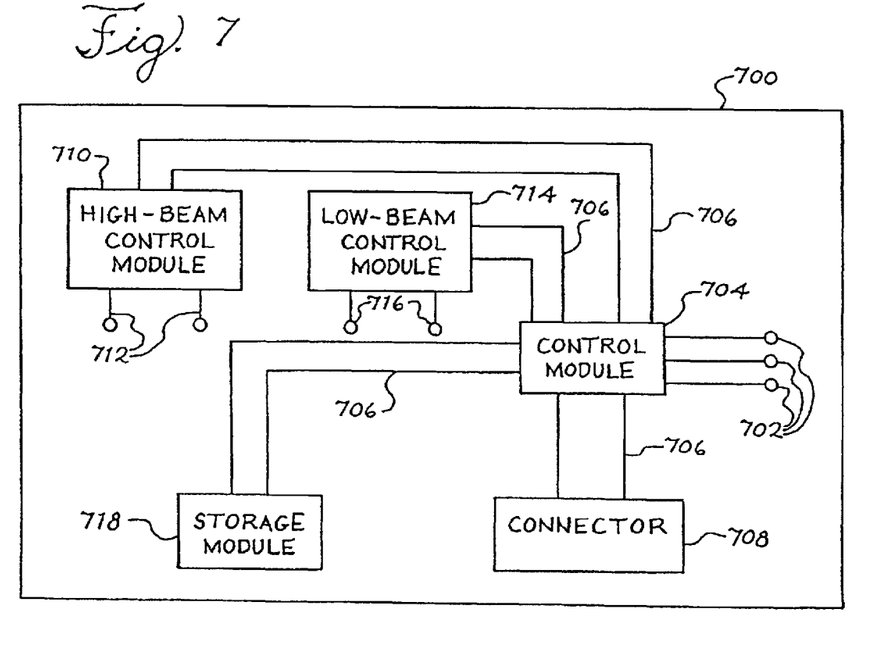
FIG. 7 is an alternate plan view of the backside of an integrated light assembly.

FIG. 7 depicts another embodiment of a substrate 700 with numerous modules and traces mounted thereon. Control module 704 mounts onto the substrate 700 and receives only three inputs from the vehicle control through conductors/traces 702. These three inputs may be a communication/command circuit, positive power, and ground or negative power. Control module 704 may include a microprocessor controller or other control device, and may also include a printed circuit board with other components and functions. These functions may include one or more memories, a battery or capacitor for storing electrical energy, and other functions.

Control module 704 is connected to other modules or controllers 708, 710, 714 and 718 by traces 706. In one embodiment, module 708 is a mechanical connector for an antenna (not shown) mounted on the opposite side of substrate 700. Module 710 may be a control module for a high-beam headlight, supplying power via traces 712, while module 714 may be a control module for a low-beam headlight, supplying power via traces 716. Module 718 may be a functional module of one of the functionalities mentioned above, such as a power storage module or an active or passive external automotive function. In one embodiment, module 718 is a battery or capacitor that stores power and allows operation of one or more of the lamps when the auto battery is dead, or during emergency situations.

Figure 8:
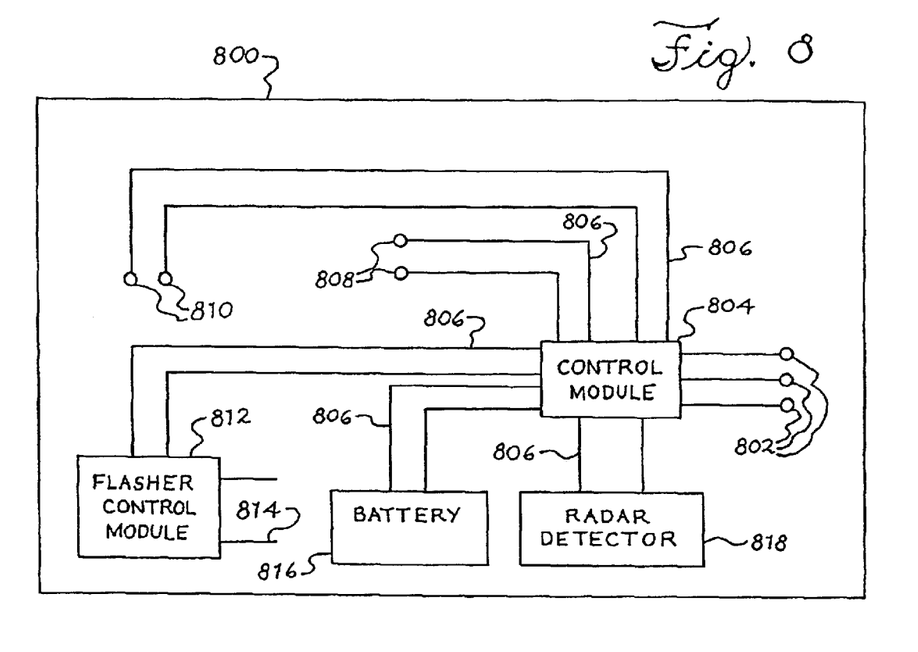
FIG. 8 is an alternate plan view of the backside of an integrated light assembly.

FIG. 8 is another embodiment depicting the rear of the substrate 800, with control module 804 mounted on the substrate 800 and connected external power/control by conductors 802. In this embodiment, the controls and the power supplies for headlights are contained within the control module. Power to the low beam lamp is supplied through traces 806 to connectors 808, while power for the high beam lamp is supplied through traces 806 to connectors 810. In this embodiment, traces 806 also connect power and control to module 812, which controls an emergency flasher (not shown) through traces 814. The embodiment also includes battery 816 and radar detector module 818, both connected to sources of power and control by one or more traces 806. While two traces are shown for convenience, it is understood that the embodiment is meant to include as many traces or conductive paths as necessary for the functioning of any given module.

Figure 9:
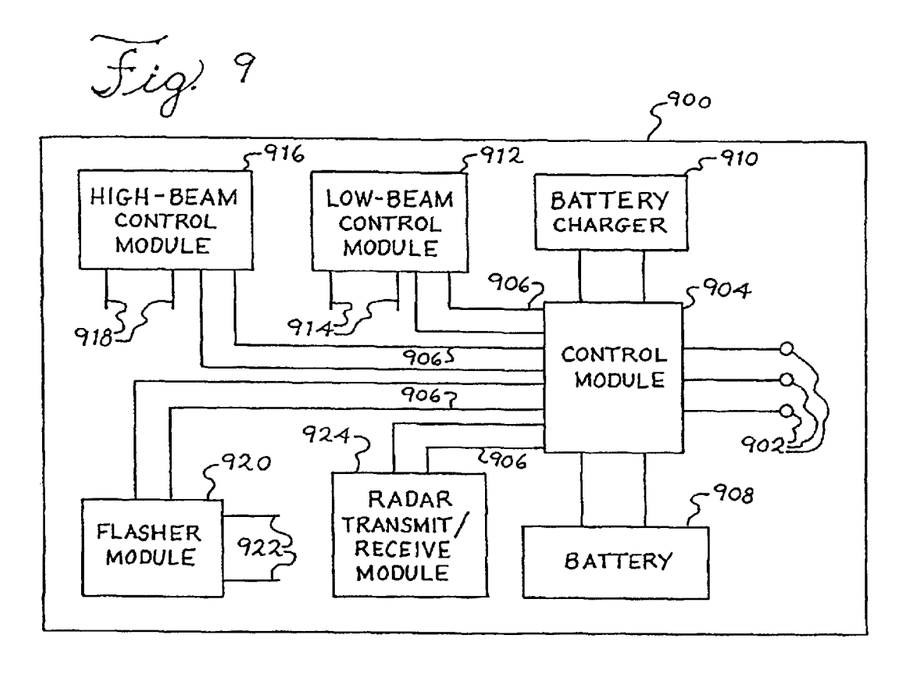
FIG. 9 is an alternate plan view of the backside of an integrated light assembly.

FIG. 9 depicts an embodiment with a number of functions. Control module 904, as well as all other modules depicted, mounts to substrate 900. Module 904 is connected to external control, command and power via conductors 902. Battery 908 connects to the control module through traces 906, as does battery charger 910. Battery charger 910 receives power from the control module and charges battery 908 for readiness in emergency situations. The battery-charging function may be a simple DC-to-DC function, taking power from the automotive battery while the vehicle is operating; or it may be more sophisticated, such as utilizing power only from a regenerative braking operation or recharging of the vehicle battery.

The embodiment of FIG. 9 also depicts low-beam control module 912, connected to the control module 904 via traces 906 and supplying power through conductors 914 to a low beam lamp (not shown). Hi-beam control module 916 receives commands and power through traces 906 and supplies power to a high beam lamp (not shown) through conductors 918. Flasher module 920 similarly receives commands and power through traces 906 and supplies power to an emergency flasher (not shown) via conductors 922. This embodiment also includes an active radar transmitter/receiver module 924, receiving power through traces 906 and relaying information back to the control module 904, such as information concerning obstacles or objects a motorist should avoid. Such information could be part of a collision-avoidance system, or could be used to alert an operator of the vehicle.

Figure 10:
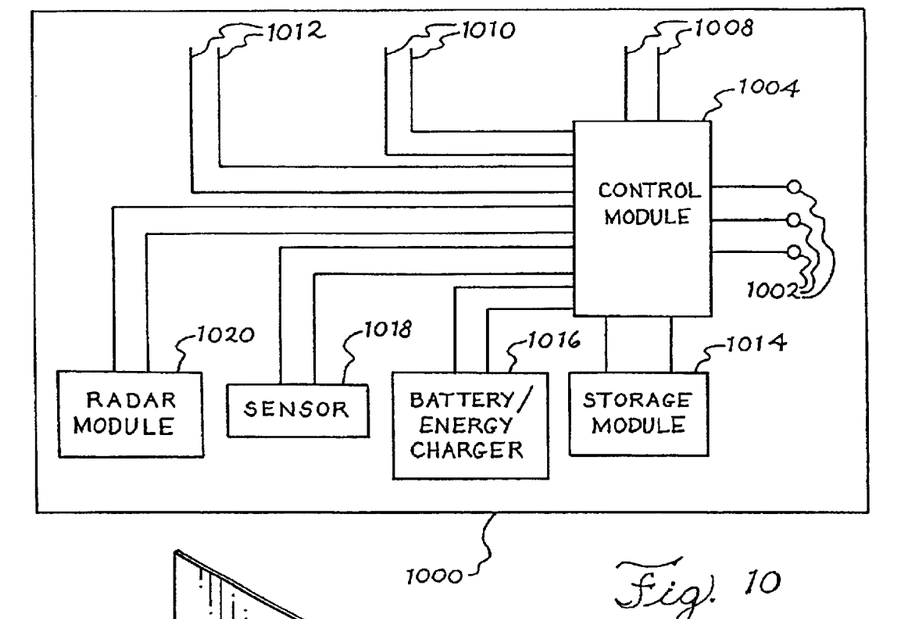
FIG. 10 is an alternate plan view of the backside of an integrated light assembly.

FIG. 10 depicts yet another embodiment, with a number of modules mounted to the substrate 1000. Included are command/control module 1004, connected by traces 1002 to external power and command/communication. In this embodiment, the command module 1004 supplies all power and controls for traces leading to a hazard-warning leads 1008, traces leading to low-beam lamp leads 1010, and traces to high-beam lamp leads 1012. Functional modules mounted to substrate 1000 may also include a battery or storage medium 1014 and a battery charger 1016. Other modules and functions may include a sensor 1018 and a radar transmitter or detector 1020.

Figure 11:
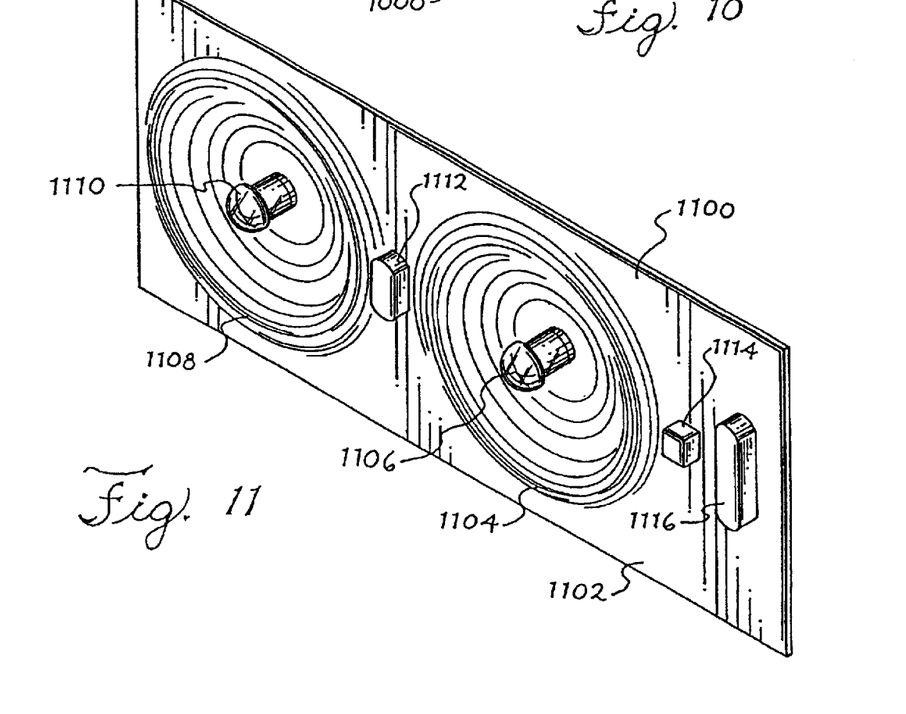
FIG. 11 is an isometric view of the front of an integrated light assembly.

FIG. 11 is an isometric front view of an embodiment of an integrated light assembly 1100. The assembly includes an insulative plastic structural layer 1102, and is bonded to reflector-shaped areas 1104, 1108. The reflector layers may be made of a reflective material, such as polished aluminum and the layers may be coextensive with and overlay structural plastic layer 1102. Apertures (not shown) may be provided for mounting illumination lamps 1106, 1110 in the reflective-shaped areas 1104, 1008. Also depicted in FIG. 11 are additional functional modules, such as radar detector 1112, antenna 1114, and tollway transponder interface 1116.

Figure 12:
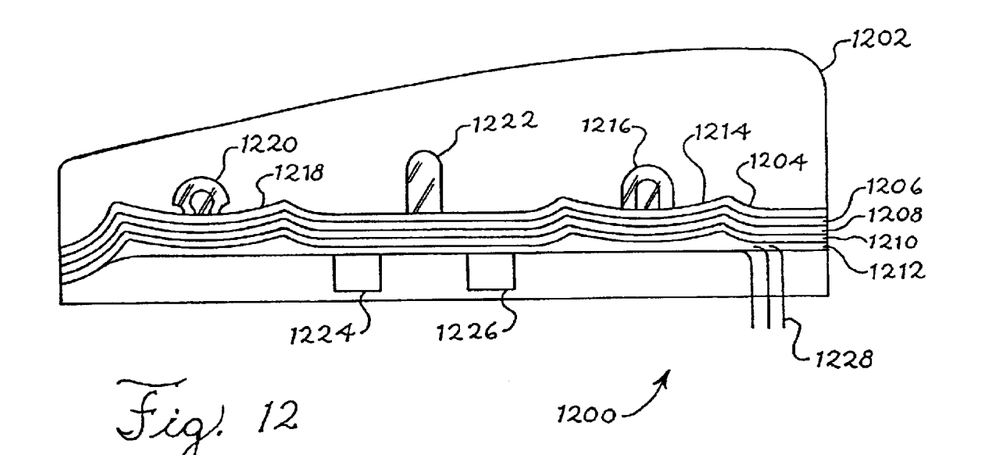
FIG. 12 is a top view of an alternative embodiment of an integrated light assembly.

FIG. 12 depicts a top view of another embodiment of an integrated light assembly 1200. The components depicted are housed in housing 1202, whose front portion may be a translucent, clear plastic, for a head-light type assembly, or may be of a colored plastic, such as red or amber for a rear light or side light or parking light assembly. Light assembly 1200 includes a laminated composite structure to mount lamps 1216, 1220, module 1222, and control modules 1224, 1226. In one embodiment, top layer 1204 is a thin, aluminum foil, forming reflector surfaces 1214, 1218 for better reflectivity for lamps 1216, 1220. Reflector layer 1204 lies atop structural plastic layer 1206, which is insulative glass-reinforced polypropylene, about 0.125 inches thick. Adhesive layer 1208 bonds conductive layer 1210 to the structural plastic layer 1206. Conductive copper layer 1210 has been etched to leave conductive traces for electrical connections. Insulative layer 1212 is a thin layer of adhesive-backed Kapton® insulation, bonding to the conductive layer 1210 and to the structural plastic layer 1206 where the conductive copper layer has been etched. Sensor 1222 mounts to the reflective layer and the structural plastic layer. Modules 1224 and 1226 mount to the structural plastic layer also, taking care to insulate any conductive portions so as not to interfere with the electrical aspects of the assembly. The traces of layer 1210 connect to a male connector 1228, facilitating the assembly and disassembly of the integrated light assembly onto a motor vehicle.

Figure 13:
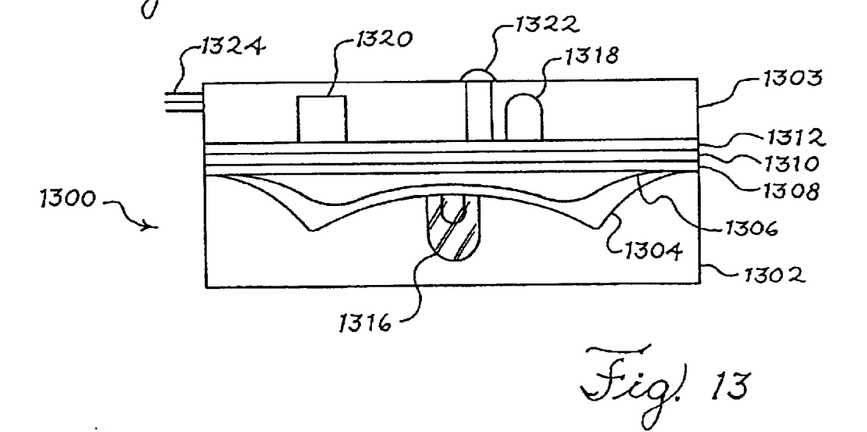
FIG. 13 is a top view of another embodiment of an integrated light assembly.

FIG. 13 depicts another embodiment of an integrated light assembly, this embodiment including a single lamp assembly 1300 which may be used as a side lamp assembly or rear lamp assembly. The lamp assembly has a housing including a front portion 1302 and a back portion 1303 which are secured together by any convenient means of assembly (not shown), including adhesives, snap-fit features, plastic welding or mechanical fasteners, such as bolts, nuts and screws. The front portion 1302 is desirably a colored plastic, such as red or amber colors used for taillights or side lights. The back portion 1303 may be any convenient plastic or material. The internal structure is a multi-layered composite structure, including a first clear plastic layer 1304, followed by a reflective aluminum layer 1306. These outer two layers are formed into a conical or ellipsoidal surface for better reflecting the light generated by lamp 1316. Lamp 1316 may be an LED cluster, or may be an incandescent lamp. Alternatively, if the assembly is an automotive hazardous warning flasher, rather than a side light or parking/running light, the lamp may be a high intensity discharge (HID) lamp.

Layer 1308 may be a second plastic structural layer to provide better support under the reflective layer 1306, and also to insulate the reflective layer 1306. Layer 1310 may be a conductive layer, made of flex print or of a conductor that has been etched to leave conductive traces where desired for connection to lamp 1316 and to modules 1318 and 1320. Layer 1312 then insulates layer 1310 from modules 1318 and 1320. In one embodiment, module 1318 is a battery for operating the light assembly remotely when disconnected from the vehicle, while module 1320 is a battery charger for charging the battery. Switch 1322 enables a user to turn on the light assembly when disconnected from the vehicle and a source of illumination is desired. Connector 1324 enables convenient connecting and disconnecting of the assembly from a motor vehicle.

Figure 14:
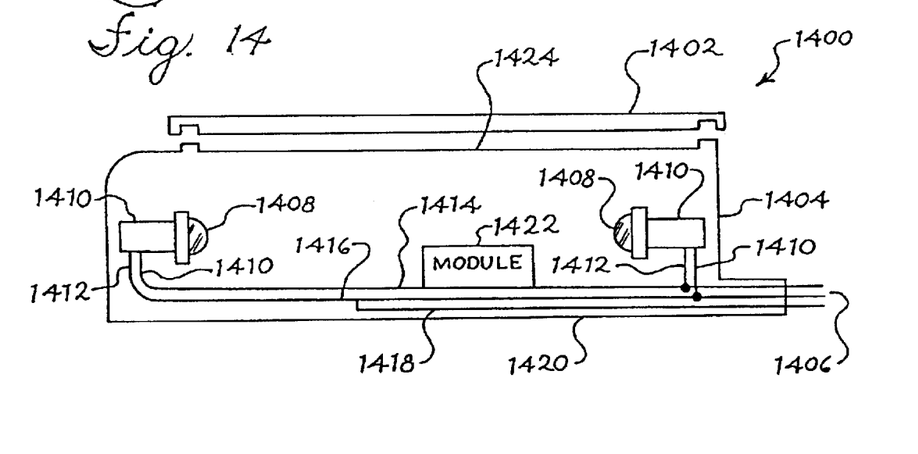
FIG. 14 is a side view of an embodiment of an interior integrated light assembly, such as an instrument cluster.

The above embodiments have concentrated on exterior lights of an automobile or automotive vehicle. An integrated light and accessory assembly may also be used in the interior of a vehicle. Uses may include a dome light assembly, an instrument panel light, a center bezel light, a climate control center light, and an entertainment center light, as well as other interior lighting assemblies. These other interior lighting assemblies may include a radio face or a radio control head, a climate control head, a center console illumination face, and an overhead console illumination face. FIG. 14 depicts an embodiment 1400 of an interior light and accessory assembly. The assembly 1400 may fit behind an instrument panel 1402 for back lighting, or may placed in plain view, as for a center dome or rear dome light, or puddle or foot well light assemblies, in a passenger car.

The assembly may include a housing 1404, and a connector 1406 for connection to a harness or other wiring. One or more lamps 1408 are connected by layers of conductive or insulative material. In this embodiment, a reflective/conductive layer 1414 as described above may overlay an insulative layer 1416 and a second conductive layer 1418. In one embodiment, the three layers 1414-1416-1418 are an etched bi-metal material, in which the second conductive layer 1418 is selectively etched to provide conductive paths to lamp terminals 1410, 1412, such as a power supply and return. The three layers may also be bonded to a portion of the housing 1404, insulative layer 1420, which may be a wall of the housing 1404. A discrete solder-mounted device, a switch, or a plug-in module 1422 may control the light assembly, for instance, by timing the maximum or minimum times the light may be light, or by incorporating any of the other properties of sensors or modules mentioned above.

Figure 15:
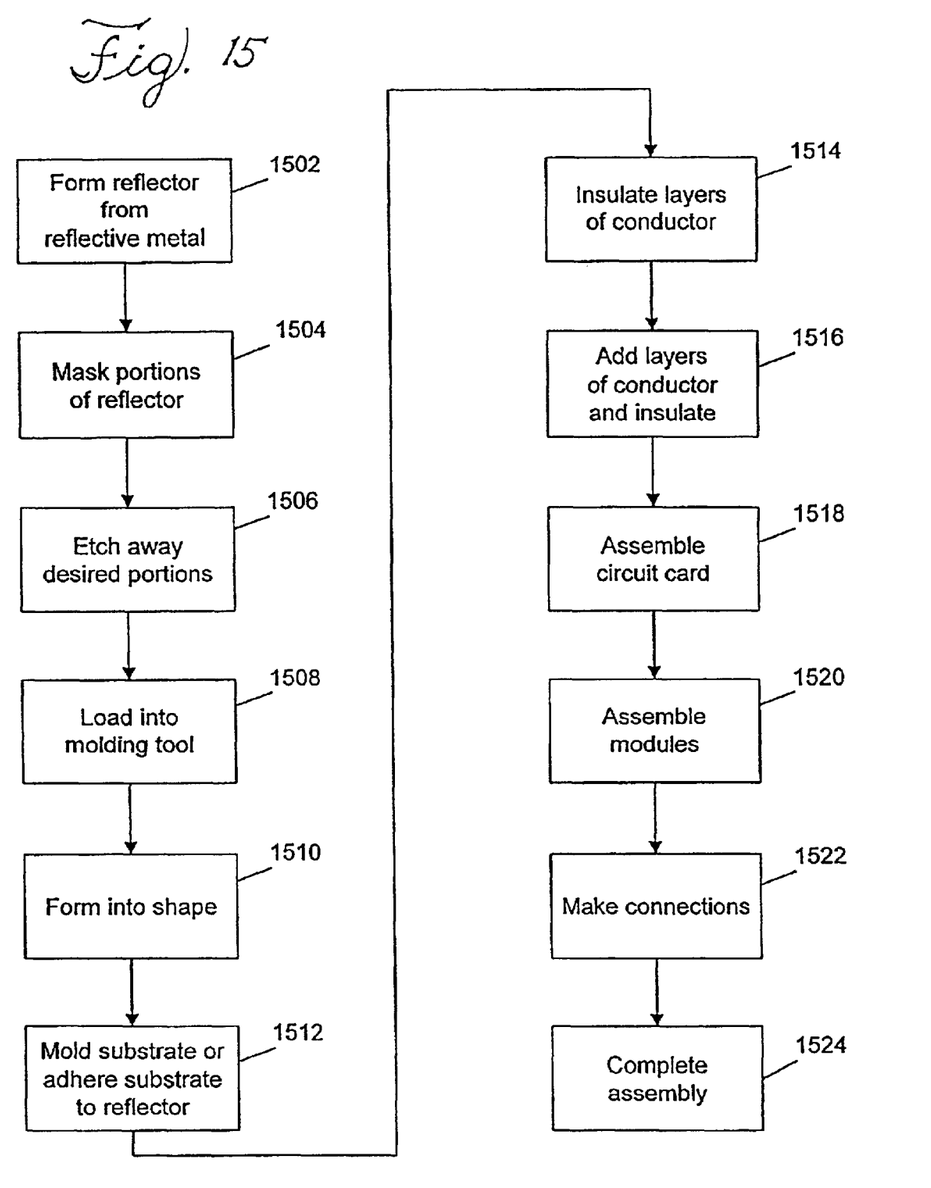
FIG. 15 is a flow chart for a method of manufacturing the integrated light assembly.
Figure 16:
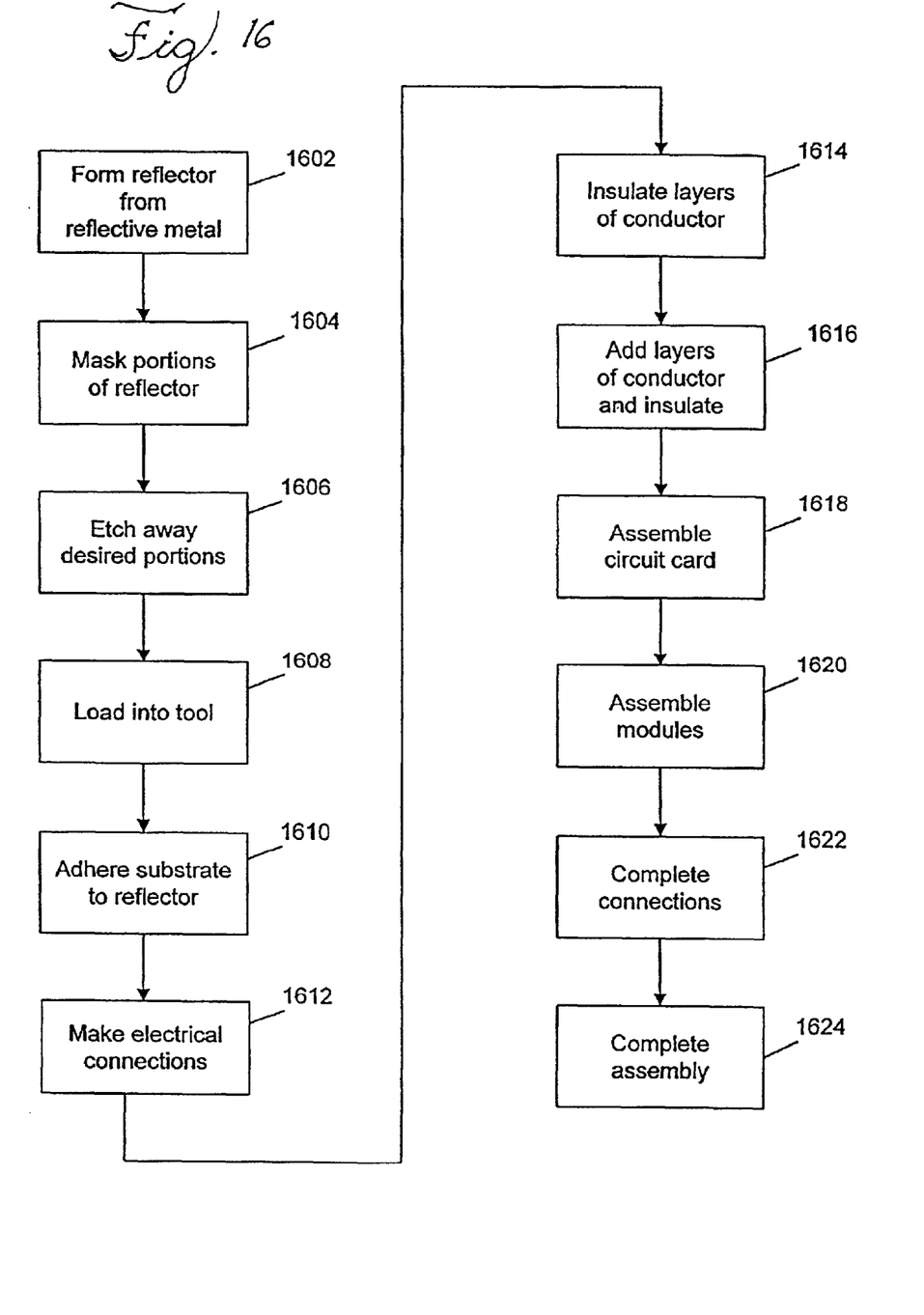
FIG. 16 is a flow chart for an alternate method of manufacturing the integrated light assembly.

In addition to the integrated light assemblies described above, there are embodiments of a method of manufacturing the integrated light assemblies. Two of the methods are depicted in FIG. 15 and FIG. 16. In FIG. 15, the method includes molding or forming a reflector from a reflective material, such as aluminum, or a metal composite material, such as etched tri-metal, a layered structure having a layer of aluminum between two layers of copper. The reflector may be thick enough to be a structural material for an integrated light assembly, or the metal may be very thin, such as a few thousandths of an inch (0.03.–0.13 mm) of polished, reflective material. In one method, a thin structure or material for such a structure is formed 1502. Portions of the metal are then masked 1504 and etched away 1506, in order to form conductors. In one embodiment, if a layered material of aluminum and copper is used for the reflective surface, the copper layer may be etched so as to leave traces or conductors on the surface for conducting electricity. In other embodiments, other materials may be used. The reflector material is then placed into a tool 1508 and shaped into place in the tool 1510. A substrate, such as a substrate made from thermoplastic or thermoset molding material, is then molded 1512 around the reflective and conductive materials. A thermoplastic material may be made using an injection molding process, while a thermoset material may be made using a compression or other molding process. If necessary, other insulators may be added to insulate any portions of the conductive layer 1514. If desired, further conductors or layers of conductors may be added, and then insulated suitably for all-weather, automotive use 1516. If a circuit board or circuit card assembly is part of the integrated light assembly, it should be added to the light assembly 1518. Any other modules desired may also be assembled 1520 for the light assembly. The necessary connections or connectors may be added 1522, and the assembly completed 1524.

It should be understood that the method is not limited to this order of making, and that other steps may be added, or used in lieu of certain of the enumerated portions herein. For instance, in some embodiments, a layer of metal for electrical connections may be separated by a layer of insulation from the reflective layer. Thus, any etching may not affect the reflective layer, but will have the desired effect on the electrical connections layer, and make electrical connections only where desired.

Another embodiment of a method is depicted in FIG. 16. A user forms a reflector or reflector material from a reflective metal or from a material having at least one reflective surface 1602. The metals may be any suitable metals, especially aluminum, alloys of aluminum, copper, and alloys of copper. The material may be a layered material, such as two or more layers of metal, or two layers of metal with an insulating layer between. If there is a layer of metal that should be etched to leave only desired conductive traces on one side, a user or manufacturer masks the portions 1604 which the manufacturer wishes to remain, and etches away the other areas of conductor 1606. The reflective portion is then placed into a tool 1608, the tool being suitable for adhering a substrate to the reflector 1610. After the adhering process, a user may make any desired electrical connections 1612 for the lamps that will be mounted so that their light-emitting portions face the reflective portions of the adhered assembly, and their electrical connecting portions will face the opposite direction. Any necessary insulating may then be accomplished 1614. If a user desires to add additional conductors, they may be added, along with any layers or insulation desired 1616. Modules or other components should have been assembled previously 1618, and may into now be added 1620 to the integrated light assembly. Any other connections desired may then be made 1622, and the assembly completed 1624 for an automotive or vehicular assembly line.

It is intended that the foregoing description illustrates rather than limits this invention, and that it is the following claims, including all equivalents, which define this invention. Of course, it should be understood that a wide range of changes and modifications may be made to the embodiments described above.

What is claimed is:

1. An integrated light and accessory assembly for a motor vehicle, comprising:
   an insulator having first and second opposing sides;
   at least one reflector mounted on the side of said insulator;
   at least one conductor mounted on the second side of said insulator;
   at least one lamp assembled on the first side and inside said at least one reflector, the at least one lamp having contacts extending through the at least one reflector and through the insulator and engaging the at least one conductor;
   at least one control module mounted on said insulator and connected to said at least one conductor; and
   a housing, enclosing the insulator, the at least one reflector, the at least one conductor, the at least one lamp and the at least one control module,
   wherein the lamp and the reflector are adapted to provide illumination, and the control module is adapted for controlling or supplying power to the at least one lamp.

2. The assembly of claim 1, wherein the lamp is selected from the group consisting of a headlamp, a fog lamp, a side lamp, a parking lamp, a hazard-warning lamp, a rear-illumination lamp, a dome lamp, and an interior lamp.

3. The assembly of claim 2, wherein the lamp is selected from the group consisting of an incandescent lamp, an LED, and a high-intensity discharge lamp.

4. The assembly of claim 1, wherein the at least one lamp is releasably mounted inside the housing.

5. The assembly of claim 1, wherein the at least one module is selected from the group consisting of a lighting control module, a power supply, a battery charger, a voltage source, a current source, a timer, a sequencer, and a microprocessor controller.

6. The assembly of claim 1, further comprising a device mounted to the insulator and connected to least one conductor inside the housing, the device selected from the group consisting of an antenna, a sensor, and a transmitter.

7. The assembly of claim 6, wherein the sensor is selected from the group consisting of a light detector, a video camera, a radar detector, a laser detector, an ultrasound detector, and an infrared detector.

8. The assembly of claim 6, wherein the transmitter is selected from the group consisting of a toll transponder, a purchasing transponder, an RF transmitter, a microwave transmitter, and an IR transmitter.

9. The assembly of claim 1, further comprising a power storage device mounted to the housing and connected to the at least one conductor.

10. The assembly of claim 9, further comprising a switch between the power storage device and the at least one lamp.

11. The assembly of claim 1, further comprising a functional module and an additional conductor, said functional module connected to said additional conductor, wherein said functional module is mounted to the insulator and is adapted to receive electric power from said additional conductor.

12. The assembly of claim 11, wherein the functional module is selected from the group consisting of a video camera controller, a radar detector controller, an active radar controller, a collision avoidance controller, a controller for a toll-collection device, and a health-monitoring sensor module.

13. The assembly of claim 1, further comprising an additional layer of insulation mounted to the at least one conductor, and a ground plane or return mounted to the additional layer of insulation.

14. The assembly of claim 1, wherein the insulators and the at least one reflector are coextensive.

15. An integrated light and accessory assembly for a motor vehicle, comprising:

an insulator;

at least one reflector mounted to said insulator;

at least one conductor mounted to said insulator;

at least one lamp connected to said at least one conductor and assembled inside said at least one reflector;

an electronic module mounted on said insulator and connected to said at least one conductor; and a housing, enclosing the insulator, the at least one reflector, the at least one conductor, the at least one lamp and the at least one control module, the lamp and the reflector being adapted to provide illumination, the electronic module being adapted for controlling or supply power to the at least one lamp, the at least one reflector having a contoured shape to facilitate illumination, the insulator having a contoured shape corresponding to the shape of the reflector.

16. The integrated light and accessory assembly of claim 15, wherein the lamp is selected from the group consisting of a headlamp, a fog lamp, a side lamp, parking lamp, a hazard-warning lamp, a rear-illumination lamp, a dome lamp, and an interior lamp.

17. The integrated light and accessory assembly of claim 15, wherein the electronic module is selected from the group consisting of a sensor, an antenna, a transmitter and a controller.

18. The integrated light and accessory assembly of claim 17, wherein the sensor is selected from the group consisting of a light detector, a video camera, a radar detector, a laser detector, an ultrasound detector, and an infrared detector.

19. The integrated light and accessory assembly of claim 17, wherein the transmitter is selected from the group consisting of a toll transponder, a purchasing transponder, an RF transmitter, a microwave transmitter, and an IR transmitter.

20. The integrated light and accessory assembly of claim 17, wherein the controller is selected from the group consisting of a lighting module controller, a video camera controller, a radar detector controller, an active radar controller, a collision avoidance controller, a controller for a toll-collection device, and a health-monitoring sensor module.

21. The integrated light and accessory assembly of claim 15, wherein the insulators and the at least one reflector are coextensive.

22. An integrated light and accessory assembly for a motor vehicle, comprising:

an insulator;

at least one reflector mounted on said insulator;

at least one conductor mounted on said insulator;

an additional layer of insulation mounted to the at least one conductor, and a ground plane or return mounted to the additional layer of insulation;

at least one lamp connected to said at least one conductor and assembled inside said at least one reflector;

at least one control module mounted on said insulator and connected to said at least one conductor; and a housing, enclosing the insulator, the at least one reflector, the at least one conductor, the additional layer of insulation, the ground plans or return, the at least one lamp and the at least one control module, wherein the lamp and the reflector are adapted to provide illumination, and the control module is adapted for controlling or supplying power to the at least one lamp.

* * * * *